(12) United States Patent
Kawashita et al.

(10) Patent No.: US 8,231,772 B2
(45) Date of Patent: Jul. 31, 2012

(54) POWER FEEDING METHOD, CONTINUOUS ELECTROLYTIC PLATING APPARATUS FOR WEB AND METHOD FOR MANUFACTURING PLASTIC FILM WITH PLATED COATING FILM

(75) Inventors: Mamoru Kawashita, Otsu (JP); Fumiyasu Nomura, Otsu (JP); Shintaro Kuge, Konan (JP); Toru Miyake, Iwase-gun (JP)

(73) Assignees: Toray Industries, Inc., Tokyo (JP); Toray Advanced Film Co., Ltd., Tokyo (JP)

( * ) Notice: Subject to any disclaimer, the term of this patent is extended or adjusted under 35 U.S.C. 154(b) by 756 days.

(21) Appl. No.: 12/294,715

(22) PCT Filed: Mar. 26, 2007

(86) PCT No.: PCT/JP2007/056145
§ 371 (c)(1),
(2), (4) Date: Mar. 16, 2009

(87) PCT Pub. No.: WO2007/116667
PCT Pub. Date: Oct. 18, 2007

(65) Prior Publication Data
US 2010/0170802 A1 Jul. 8, 2010

(30) Foreign Application Priority Data
Mar. 29, 2006 (JP) ................... 2006-091496

(51) Int. Cl.
C25D 7/06 (2006.01)
(52) U.S. Cl. ....................................... 205/138
(58) Field of Classification Search .................... 205/138
See application file for complete search history.

(56) References Cited

U.S. PATENT DOCUMENTS 3,539,490 A * 11/1970 Gannoe .................. 204/207
2003/0051999 A1 * 3/2003 Hubel ................. 204/297.01

FOREIGN PATENT DOCUMENTS

| JP | 59103762 | | 7/1984 |
| JP | 62136599 A | * | 6/1987 |
| JP | 2007 022473 | | 1/1995 |
| JP | 2008 209383 | | 8/1996 |
| JP | 09003691 A | * | 1/1997 |
| JP | 2001 1323395 | | 11/2001 |
| JP | 2002 246424 | | 8/2002 |
| JP | 2002246424 A | * | 8/2002 |
| JP | 2003 321796 | | 11/2003 |
| JP | 2004 204349 | | 7/2004 |
| JP | 2004 263215 | | 9/2004 |
| JP | 2005 248269 | | 9/2005 |
| WO | WO 03/038159 | | 5/2003 |

OTHER PUBLICATIONS

International Search Report for PCT/JP2007/056145, completed Jun. 18, 2007 and mailed Jun. 26, 2007 (w/ Partial English language translation).

* cited by examiner

*Primary Examiner* — Edna Wong
(74) *Attorney, Agent, or Firm* — RatnerPrestia

(57) ABSTRACT

Two rotating members placed to face each other and nipping a web such that only an end of the web provided with conductivity is pressed are provided, at least one of the rotating members serves as a feeding electrode, and these rotating members are rotated about the same velocity to a transportation velocity of the web.

8 Claims, 12 Drawing Sheets

[Fig.1A]
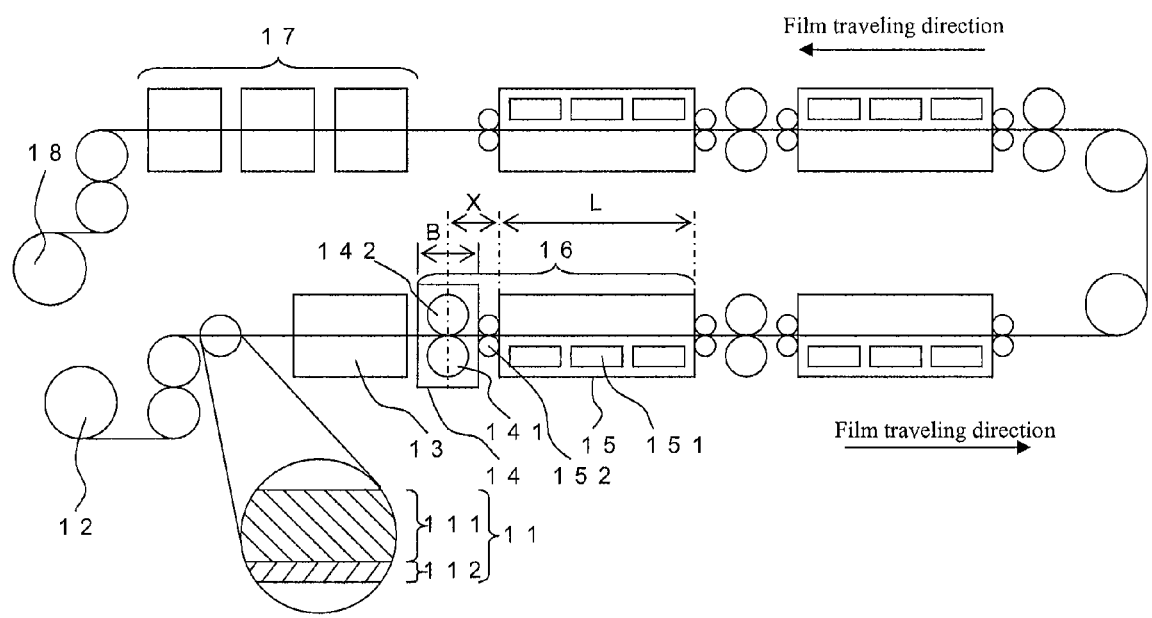

[Fig.1B]
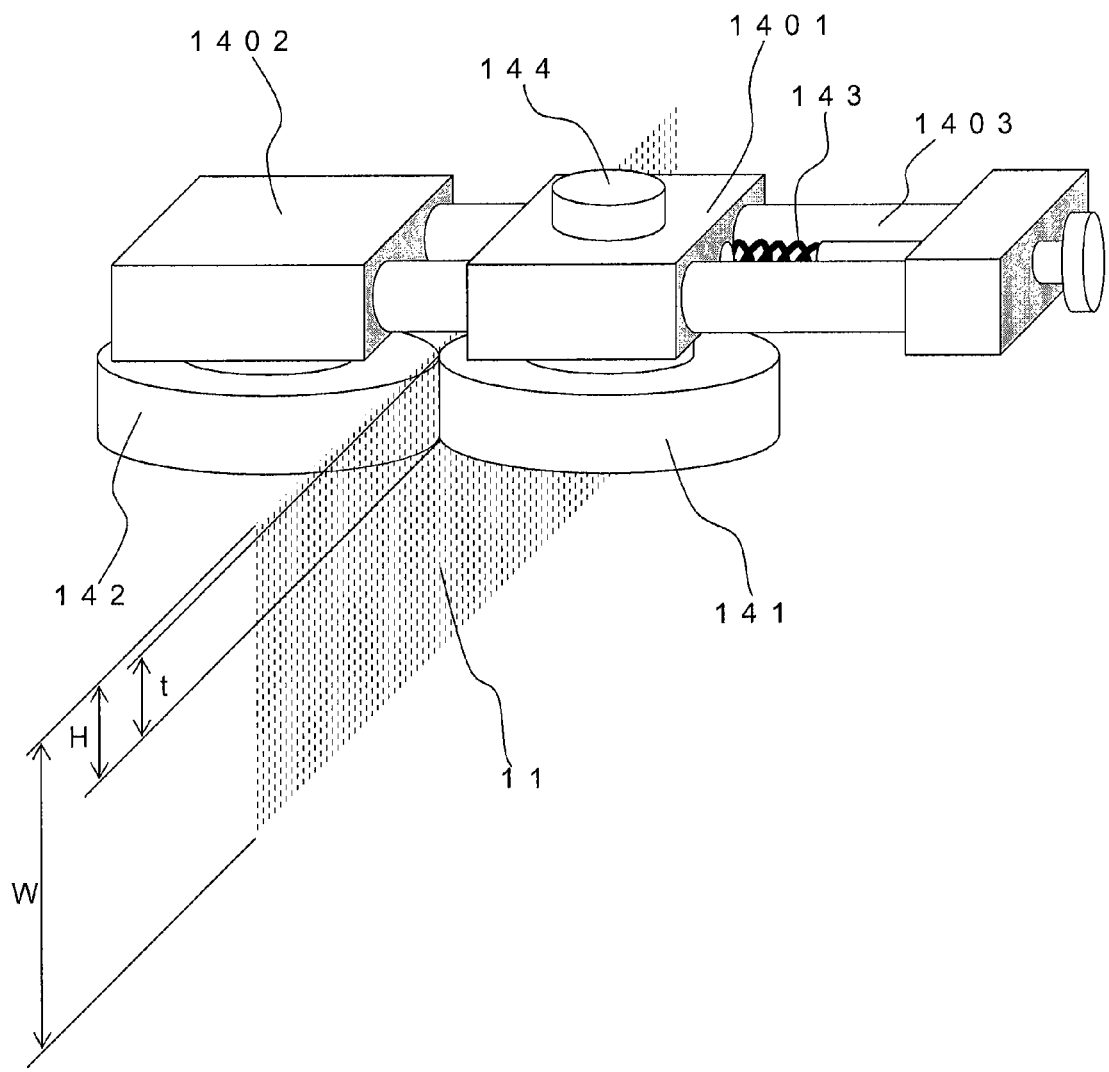

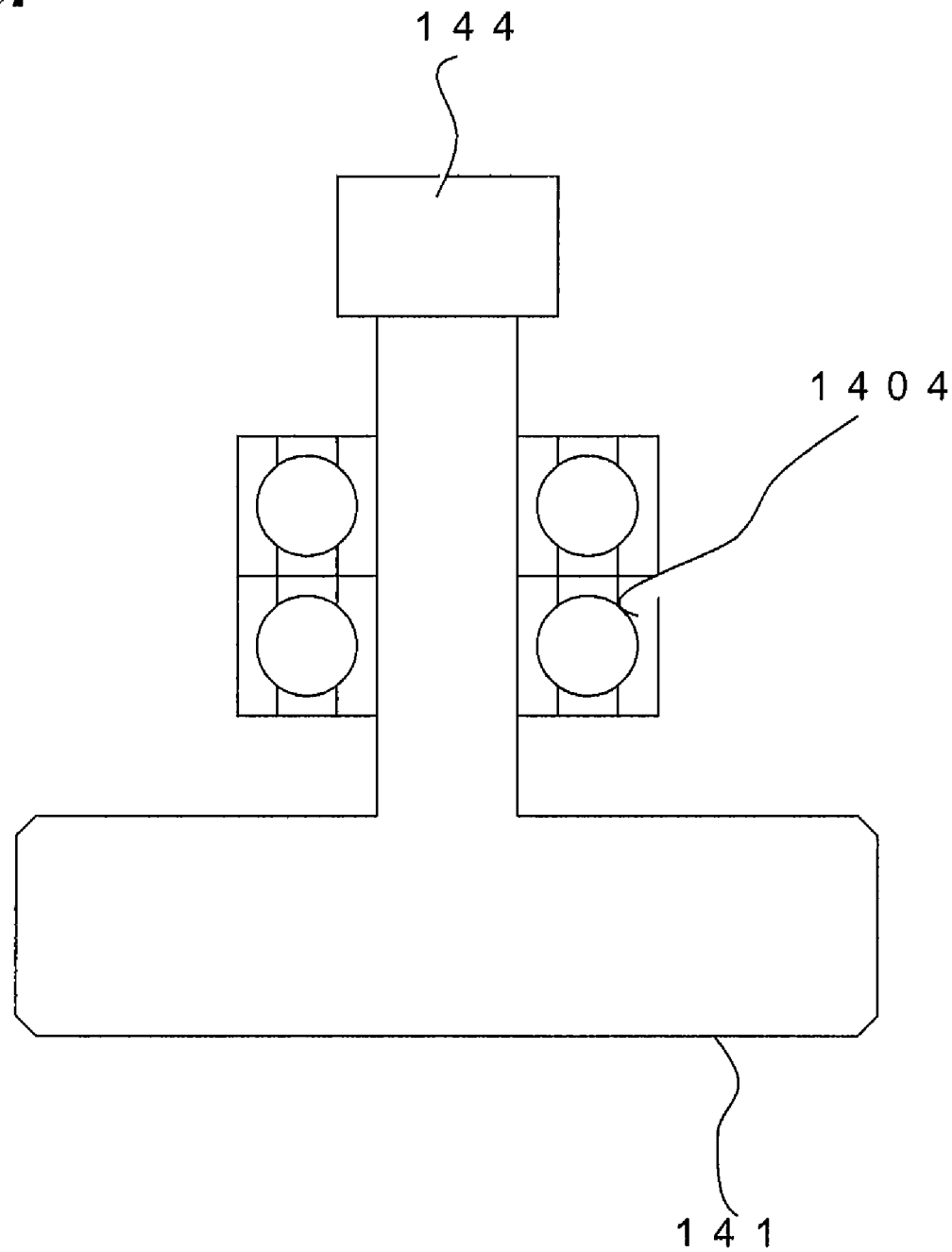
[Fig.1C]

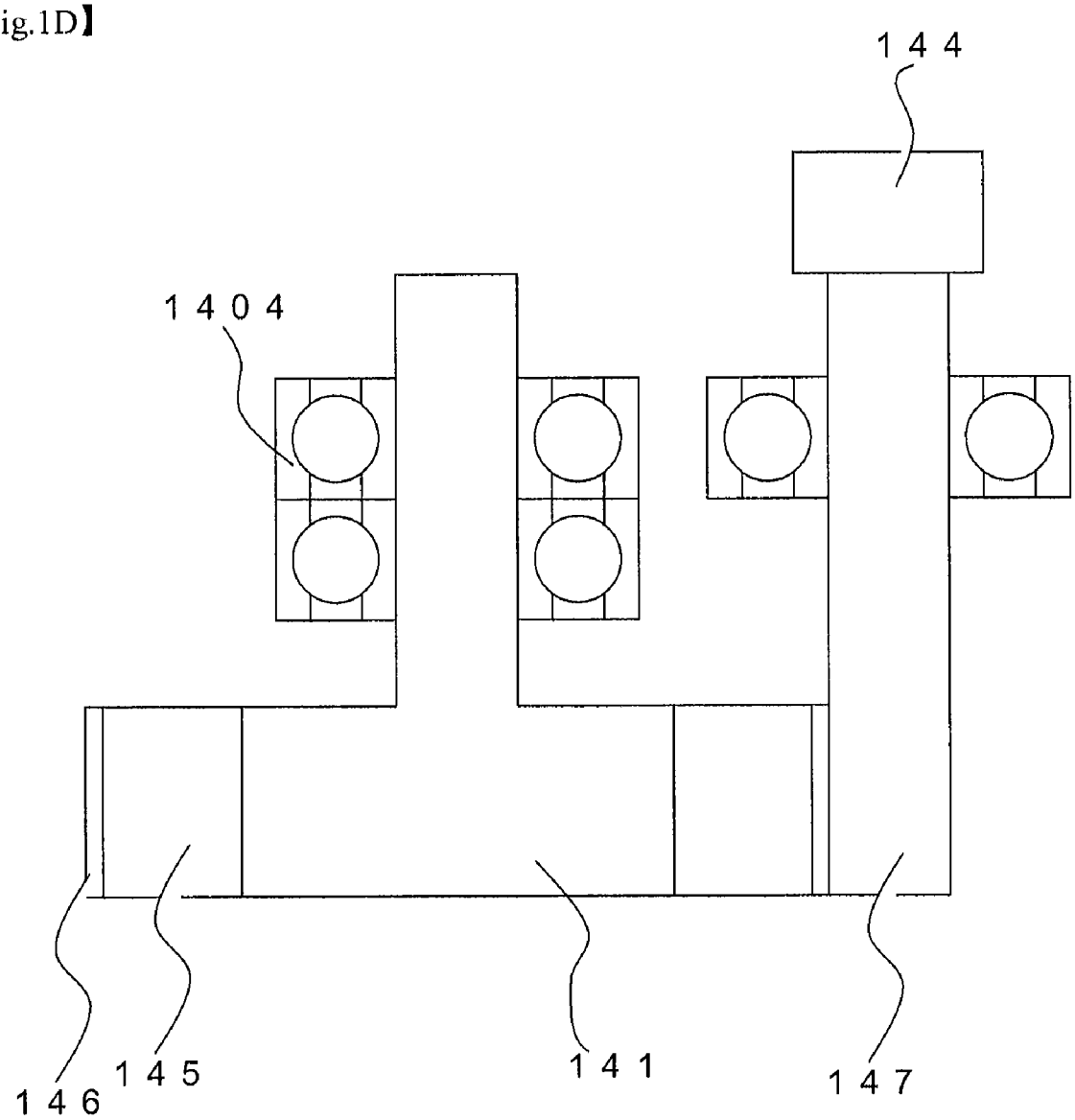
[Fig.1D]

[Fig.2]
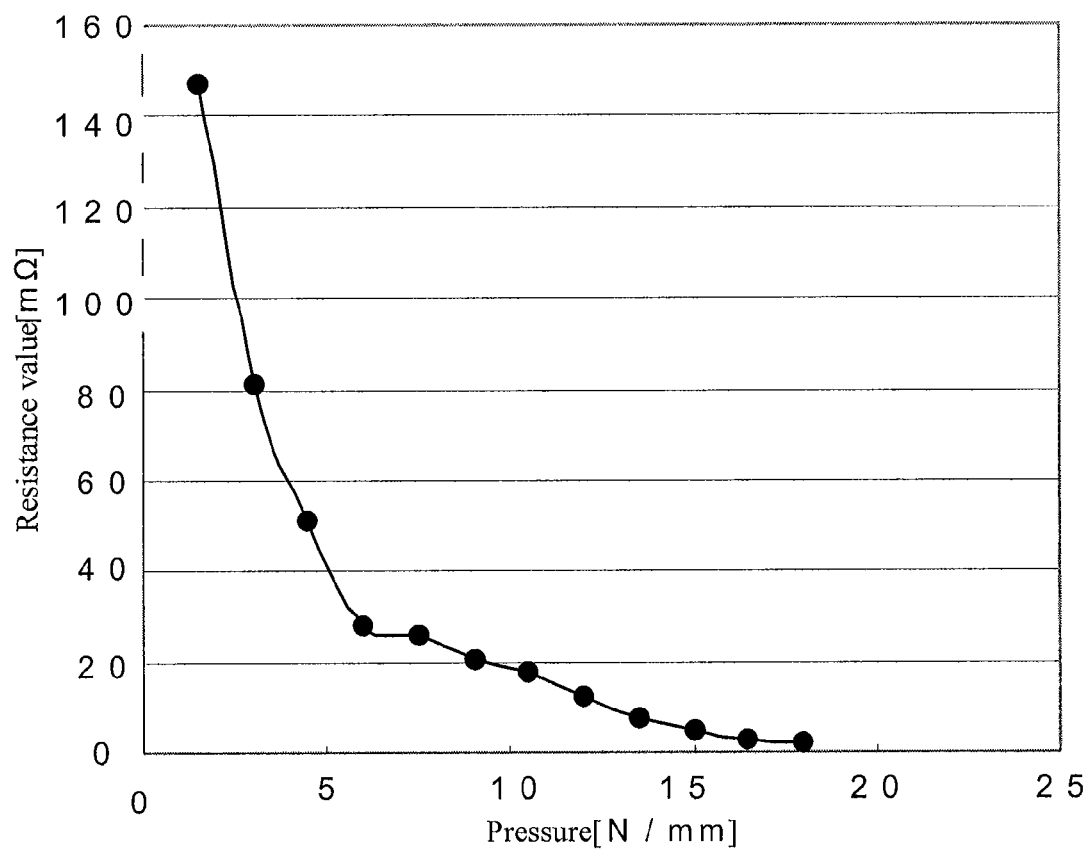

[Fig.3]
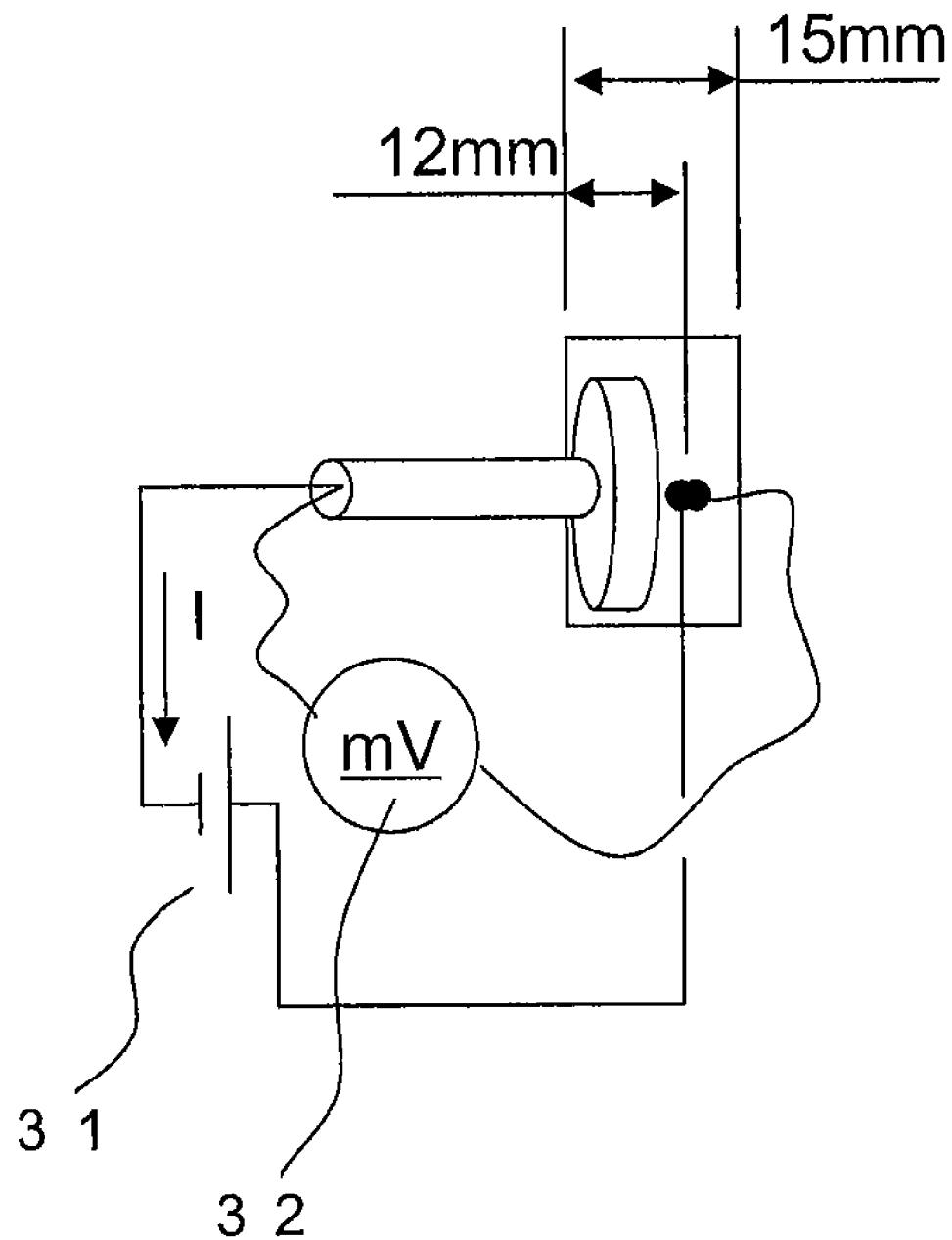

[Fig.4]
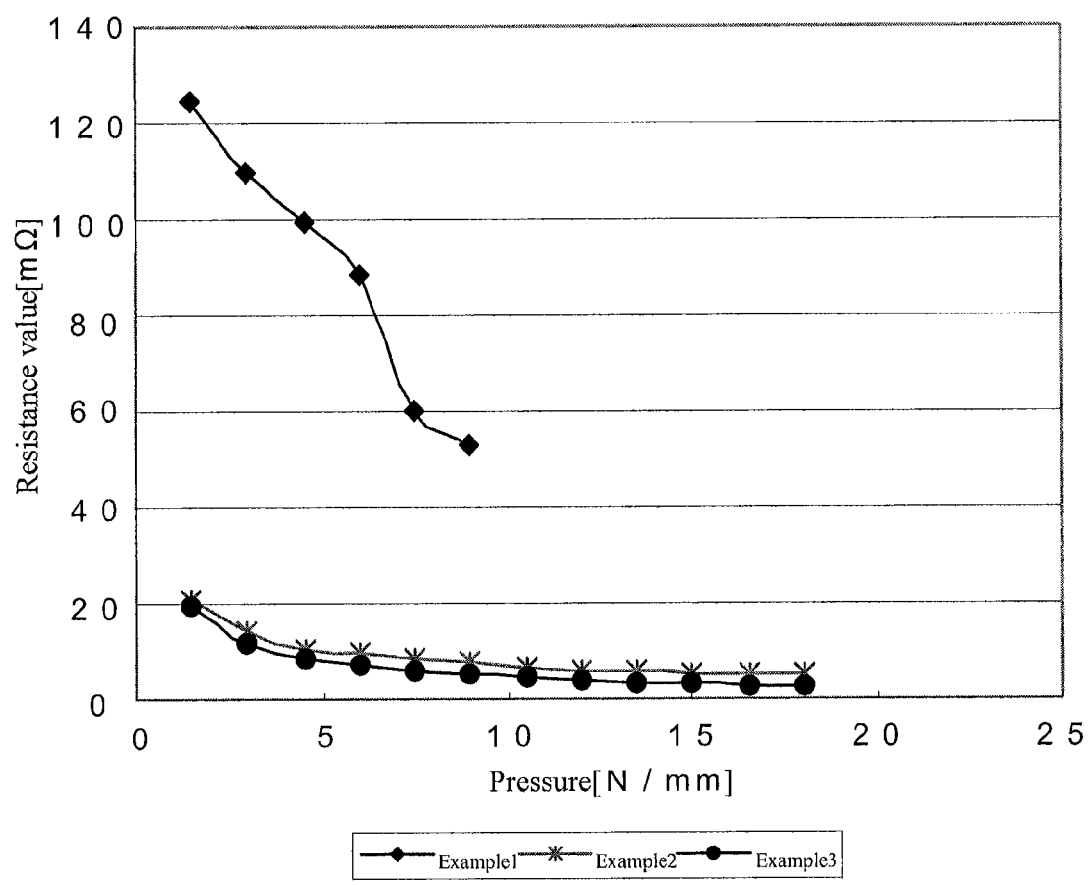

[Fig.5]
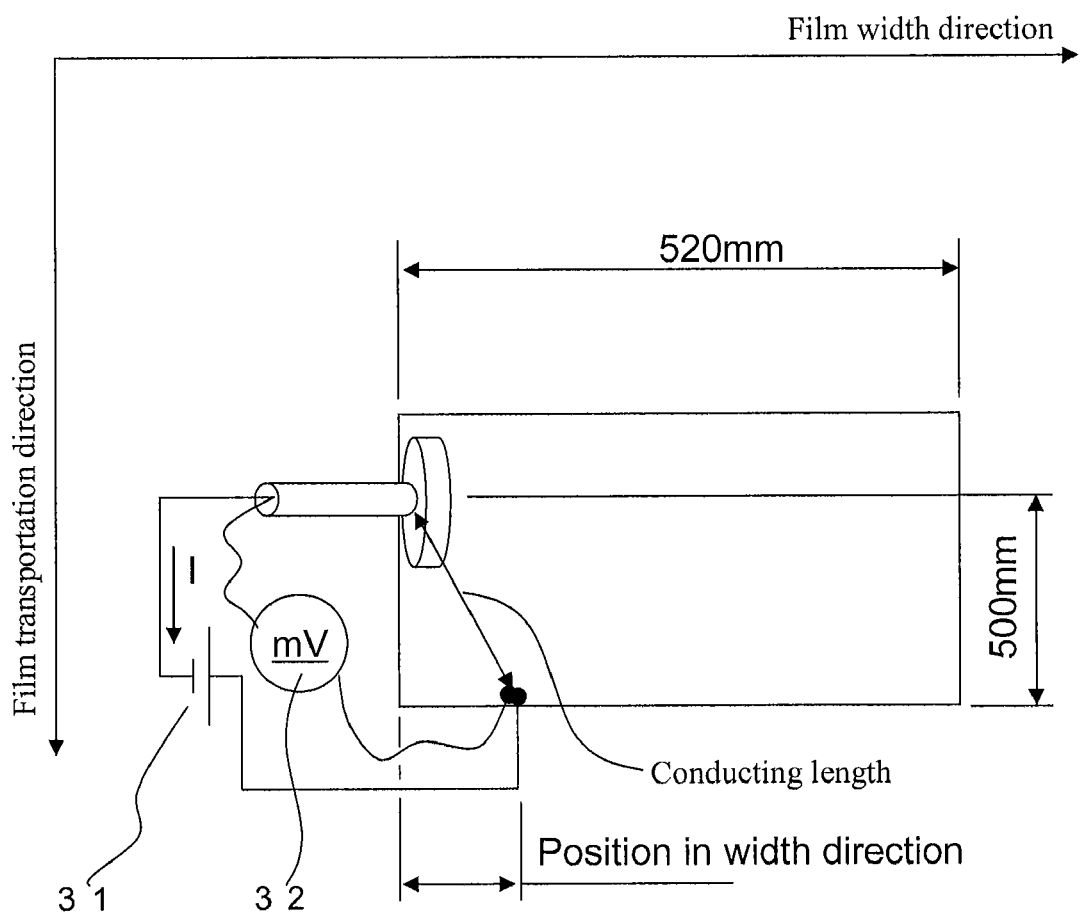

[Fig.6]
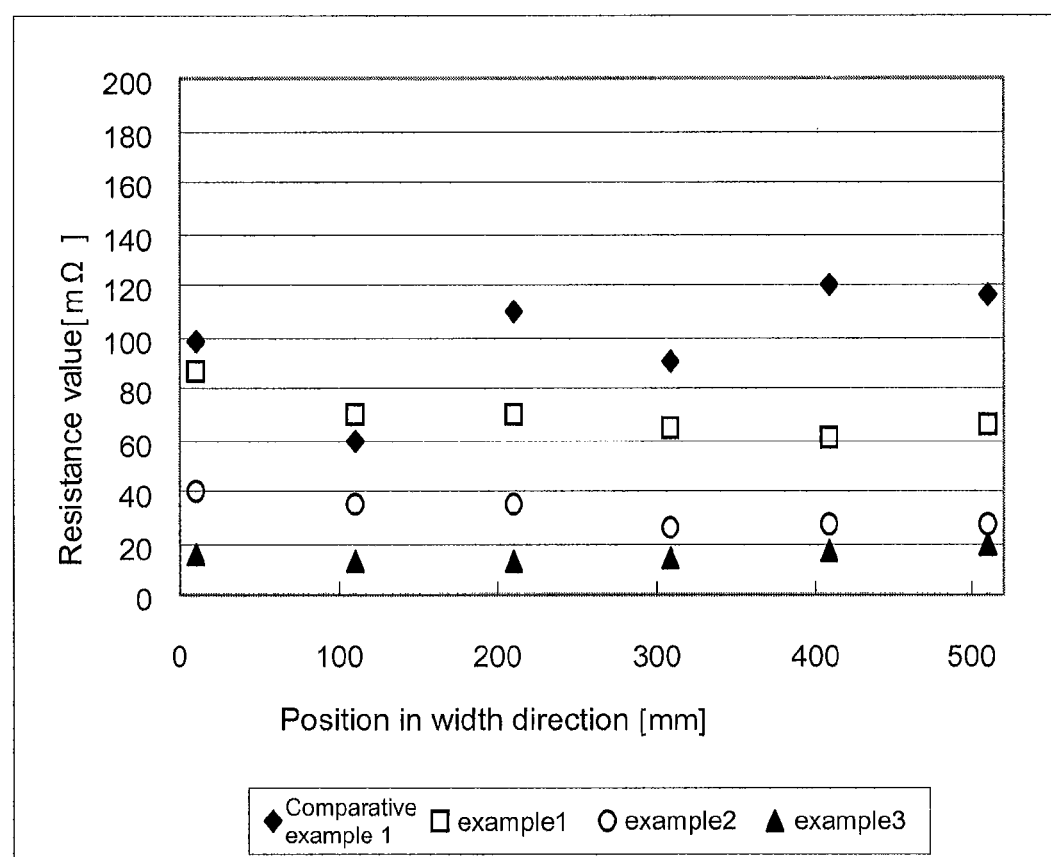

[Fig.7]
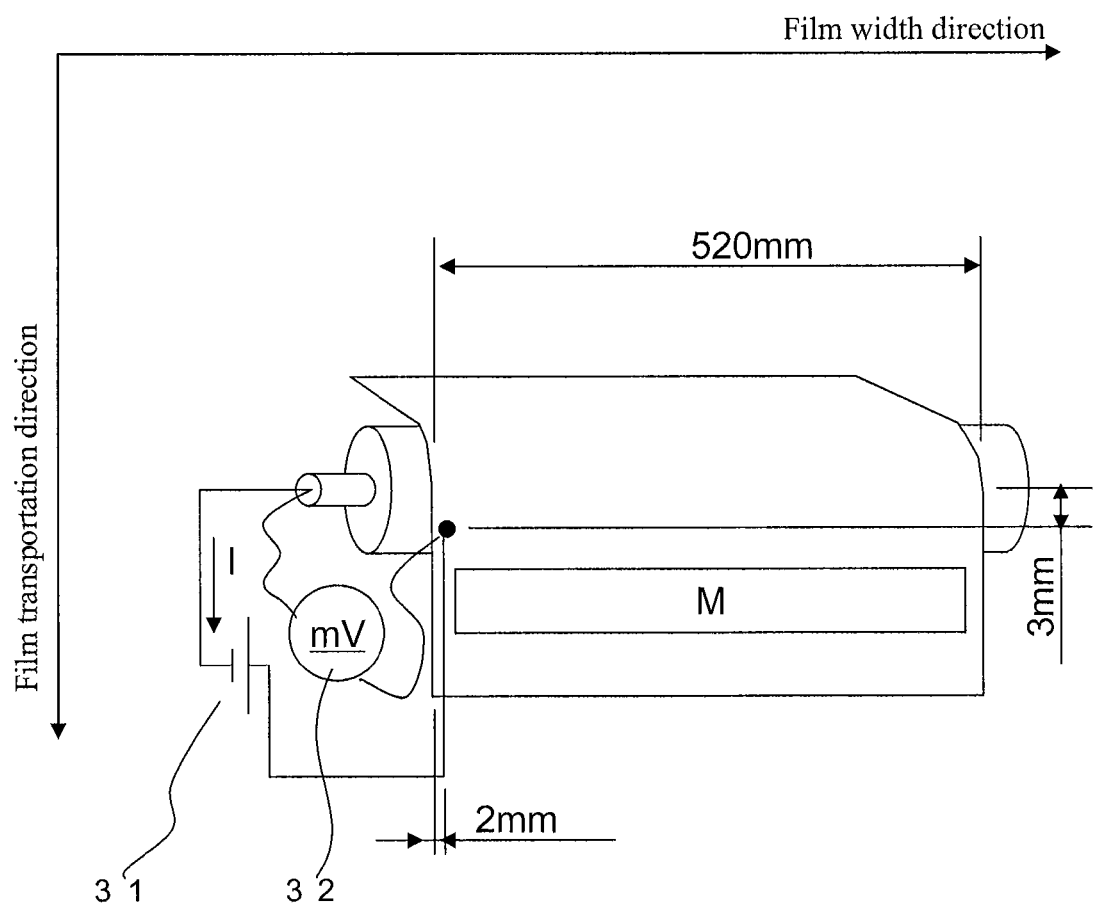

[Fig.8]
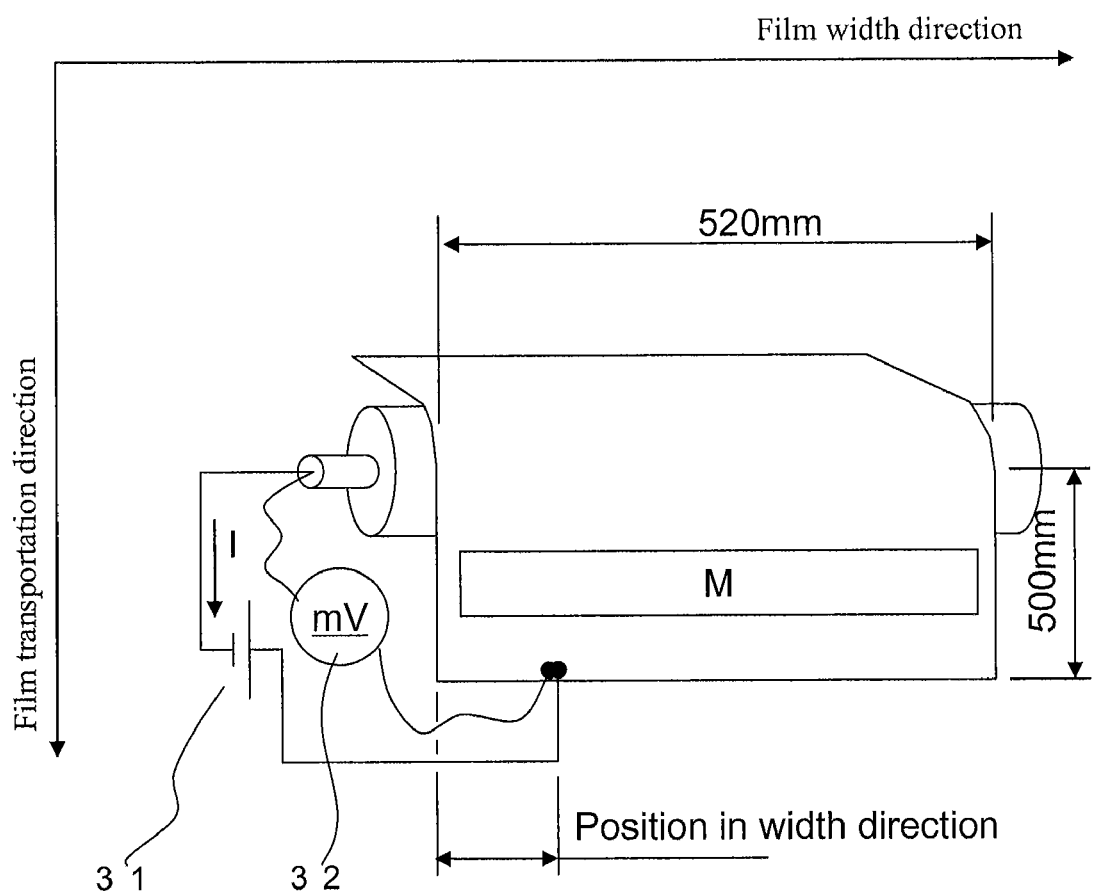

[Fig.9]
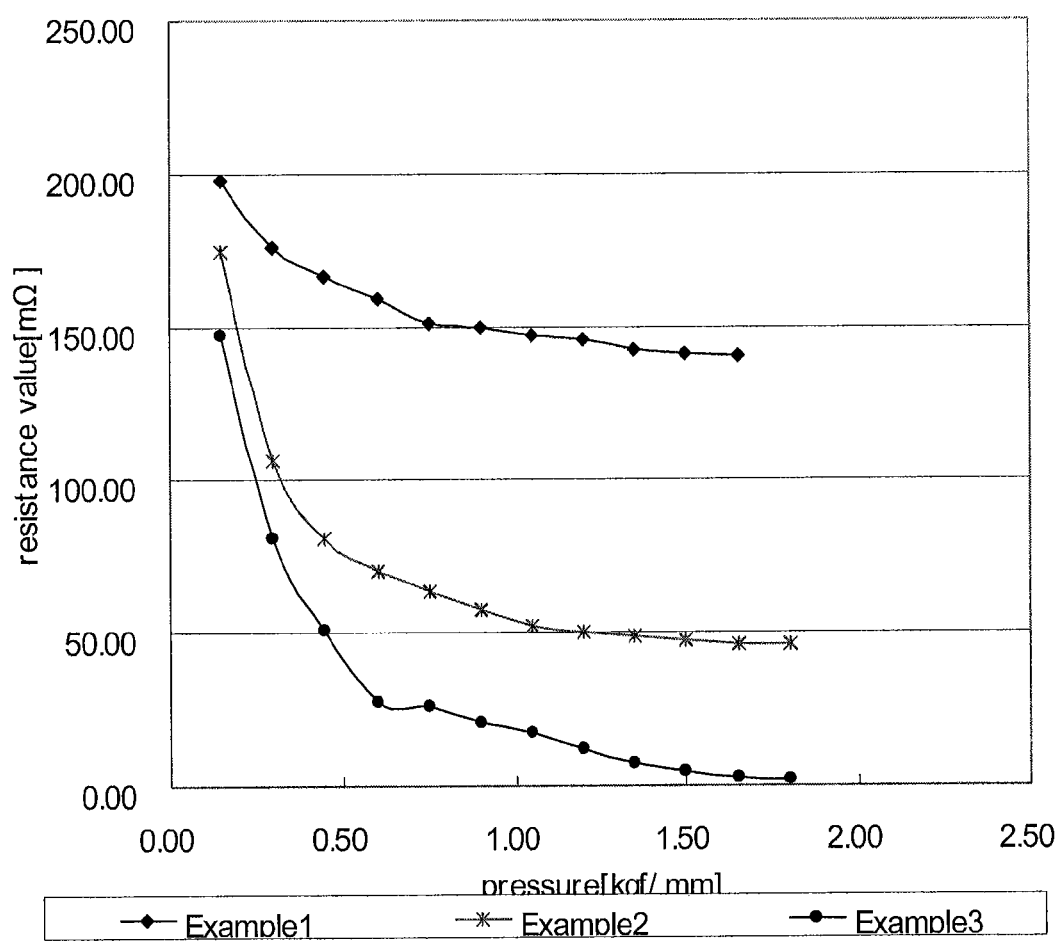

POWER FEEDING METHOD, CONTINUOUS ELECTROLYTIC PLATING APPARATUS FOR WEB AND METHOD FOR MANUFACTURING PLASTIC FILM WITH PLATED COATING FILM

This is a U.S. National Phase application of application number PCT/JP2007/056145, filed Mar. 26, 2007 (which is incorporated herein by reference in its entirety), which claims priority benefit of JP 2006-091496 filed Mar. 29, 2006.

FIELD OF THE INVENTION

The present invention relates to a power feeding method, a continuous electrolytic plating apparatus for web, and a method for manufacturing a plastic film with a plated coating film.

BACKGROUND OF THE INVENTION

As a conventionally known method for continuously forming a plated coating film, such as a plastic film, on a web while transporting the web, a conductive surface of the web or a metallic web contact is made to contact a cathode roller, and a plating bath in which an anode is placed is provided before or after the cathode roller, so that the plated coating film is formed by the plating bath. In the case where the plated coating film is continuously formed on the web according to the method, wherein the web continuously travels through the unit provided with the cathode and anode, a plated coating film having a desirably large thickness can be easily formed on the web (see the Patent Document 1).

As an example of a substrate used for flexible circuit which has been increasingly often used in an electronic device, an electronic component, a semiconductor package and the like in recent years, a wiring substrate, wherein a polyimide film or a polyester film and a copper foil are bonded to each other, is attracting attention. There are two different types of the substrate used for flexible circuit thus constituted, which are so-called "triple-layered type", where a copper foil is bonded to the web via an adhesive, and so-called "double-layered type", where a metallic coating film is formed on the web by means of the plating without any adhesive. Of these two different substrates, the latter "double-layered type" substrate is more spotlighted these days in tandem with the advancements in the miniaturization of circuit wiring pitches.

The current status relating to the substrate for flexible circuit is described below. The triple-layered substrate for print circuit, wherein epoxy-based resin or acrylic resin is used as the adhesive, is disadvantageous in that its electric characteristics are deteriorated due to impurity ions included in the material of the adhesive. Further, in the case where polyimide is used as a base film material, it is not possible to fully take advantage of such a high heat resistance thereof (at least 300° C.) because a heat-resistant temperature of the adhesive is at most 100-150° C. Therefore, it is inevitable to reduce the specification of a heating temperature in the wire bonding for an IC chip for which high temperatures are demanded in the mounting process. In the triple-layered substrate for print circuit, the copper used therein is too thick for such a patterning as at most 80 µm pitch (copper wiring 40 µm, gap 40 µm) because the copper foil is generally as thick as 18 µm or 35 µm, and an etching ratio is thereby significantly reduced. As a result, a large difference is generated between a surface-side circuit width and an adhesive-side circuit width of the copper foil or a whole circuit width is significantly reduced due to the etching, which disadvantageously results in the failure to obtain a targeted circuit pattern.

Therefore, the so-called "double-layered type" substrate was proposed in order to solve the problems in the triple-layered type substrate thus described. The so-called "double-layered type" substrate is obtained such that the electrolytic copper plating is applied after various metals are deposited on the web surface by means of the various deposition processes such as the PVD process such as vacuum deposition, sputtering process or various ion plating processes and so-called CVD process wherein chemicals including metals are vaporized and thereby deposited, or various metals are plated by means of the electroless plating in place of the adhesive. The "double-layered type" substrate is characterized in that a copper film thickness can be arbitrarily changed by the electrolytic copper plating, wherein a 40 µm-pitch circuit pattern can be generated in a simple manner provided that the thickness of the copper film is 8 µm, and heat resistant temperatures of different webs can be directly reflected thereon.

In order to respond to the current status thus far described, there is a high demand for a film having a plated coating film. However, in the conventional method, wherein the conductive surface of the web in contact with the cathode roller is transported as described earlier, scratches and burred protrusions resulting from the scratches may be generated on the conductive surface of the web which is rather vulnerable. Further, an entire length of the cathode roller, which contacts an entire width of the web, is increased as the width of the web is increased, which makes it necessary to increase a diameter of the roller in order to maintain the strength. As a result, the power feeding apparatus is unfavorably increased in size.

The miniaturization of the circuit pattern has been advancing in recent years, and an increasing higher surface quality has been accordingly demanded for the plated coating film. Therefore, the development of a process capable of preventing the generation of very small scratches and protrusions is aggressively moving forward.

The Patent Document 2 proposed a process called a clipping method, wherein an end of the web is nipped with feeding clips, and the end-nipped web is carried through the plating liquid to be plated. According to the method, wherein only the end of the web, which will be removed when the web is finalized as a product, is nipped, no minor scratches or the like are generated in the product, and the surface thereby obtained has a good quality. However, a heavily-developed additional facility, which includes a large-sale transportation system for transporting the feeding clips, a process for removing the plated coating film deposited on the feeding clips and the like, becomes necessary. Further, it is demanded that the plating liquid be as least polluted as possible because foreign matters floating in the plating liquid may disadvantageously roughen the plated surface. However, the plating liquid, in fact, is easily polluted by such foreign matters as abrasion powder because various moving units are placed above the plating liquid. Further, the section nipped with the feeding clips is not plated, and a resistance value is increased because the film thickness of the conductive film is reduced only in the section. As a result, a periphery of the section may be color-changed or altered by the Joule heat generated when large currents are supplied.

The Patent Document 3 recites a plating method wherein a feeding electrode having a plate spring shape is pushed against the end of the web to supply power to the web so that the web is plated. The method can also provide such a good surface quality that scratches or the like are not included in the final product. However, the feeding electrode is easily worn because it is constantly in close contact with the web, and the plating liquid and peripheral devices are polluted by powder generated by the abrasion. Further, the presence of the electrode constantly applies the brake to the web, and a tensile force distribution is thereby generated in the width direction of the web, which may significantly disturb the transportation of the web in a stable manner.

The Patent Document 4 recites an example of a conventional vertical-type plating device in which a feeding electrode having a roller shape is provided. In the example, a feeding electrode having a so-called dumbbell shape in which an outer diameter of the roller at the center is reduced so that both ends thereof alone contact the web was proposed as one of possible shapes of the cathode roller. According to the method, a product, in which the surface flaw such as scratches is reduced at the center of the web not contacted by the roller, can be produced. However, an angular velocity of the roller is equal at the both ends, and therefore, a circumferential velocity is different at the both ends even if a very small difference is generated between outer diameters of the both ends contacting the web. Therefore, a remarkably high working precision is demanded. When the high precision cannot be obtained by any possibility, such a problem that the electrode may be worn or the tensile force distribution may be generated in the width direction because one of the ends slidably contacts the web.

The Patent Document 5 recites a feeding method wherein while any contact of the center of the web is avoided in order to realize the plating without undermining the characteristics of unwoven fabric such as its bulkiness, and only an upper end of the web is exposed out of the plating bath, so that a belt-like electrode is brought into close contact with the exposed part so as to supply power. The method can also provide the plated film having such a high quality that no scratches or bruises are generated at the center, however, the film in the upper end of the web, which is not constantly plated, is very thin and subject to a large resistance. Therefore, the film is color-changed and altered by the Joule heat generated when large currents are supplied. Further, in the case of a web such as a plastic film which is poor in its elasticity in a thickness direction, when the web and the belt-shape electrode are nipped with guide rolls so that they are brought into close contact with each other by a nipping force, a contact resistance between the electrode and the web other than the nipped section is unfavorably increased because they tightly contact with each other only at the guide-roll section. Therefore, heat-related problems may be generated when large currents are supplied.

The Patent Document 6 recites a transporting method, wherein a rotating member having a small width is pressed onto a transportation roller. The rotating member can also serve as the feeding electrode. When the rotating member is set at the end of the web as the feeding electrode according to the method, a product in which flaws are reduced on a surface opposite to a surface tightly contacting the transportation roller can be manufactured. According to the inventors of the present invention, however, the method requires a roller made of a hard material because creases are unfavorably generated on the web by the edge of the electrode in the case where a soft material is used for the transportation roller. As a result, the flaws possibly generated on the surface tightly contacting the transportation roller may not be prevented.

Patent Document 1: No. H07-22473 of the Japanese Patent Application Laid-Open

Patent Document 2: No. 2005-507463 of the Japanese Translation of the PCT Applications Patent Document 3: No. 2005-248269 of the Japanese Patent Application Laid-Open Patent Document 4: No. 2003-321796 of the Japanese Patent Application Laid-Open Patent Document 5: No. H08-209383 of the Japanese Patent Application Laid-Open Patent Document 6: No. 2004-263215 of the Japanese Patent Application Laid-Open

SUMMARY OF THE INVENTION

The present invention provides an electrolytic plating apparatus capable of preventing the generation of fine flaws on a plated coating film.

The present invention relates to a power feeding method for an electrolytic plating method for electrolytically plating a web comprising a conductive surface as at least one of surfaces thereof in a plating tub while continuously transporting the web, wherein the web is nipped with at least two rotating members so that the web faces one end thereof or both ends thereof in a width direction, at least one of the rotating members is used as a feeding electrode so that the web is power-supplied, the electrode is pressed onto the web only in a region distant by at least 0.5 mm and at most 20 mm from the end of the web in the width direction with a contacting pressure of at least 0.5 N and at most 100 N per 1 mm of a contact width in the width direction, and the rotating members are rotated about the same velocity to a velocity of the transportation of the web.

An exemplary embodiment of the present invention relates to a power feeding method for an electrolytic plating method for electrolytically plating a web having conductivity on surfaces thereof in a plating tub while continuously transporting the web, wherein the web is nipped with at least two rotating members so that the web faces one end thereof or both ends thereof in a width direction, at least one of the rotating members is used as a feeding electrode so that the web is power-supplied, the electrode is pressed onto the web only in a region distant by at least 0.5 mm and at most 20 mm from the end of the web in the width direction with a contacting pressure of at least 2 N and at most 100 N per 1 mm of a contact width in the width direction, and the rotating members are rotated about the same velocity to a velocity of the transportation of the web.

In the power feeding method according to another exemplary embodiment of the present invention, only the electrode placed outside of the plating tub is used, and power is supplied in a section of the web targeted for the plating only in an upstream side and/or a downstream side of the plating tub in the transportation direction.

In the power feeding method according to still another exemplary embodiment of the present invention, the web is transported in a longitudinal direction so that the width direction thereof is along a vertical direction.

In the power feeding method according to still another exemplary embodiment of the present invention, the rotating member on a receiving side which nips the web together with the feeding electrode comprises an elastic member on a surface layer thereof.

In the power feeding method according to still another exemplary, embodiment of the present invention, the feeding electrode comprises an electrically conductive layer on a surface layer thereof and an elastic layer inside the electrically conductive layer.

In the power feeding method according to still another exemplary embodiment of the present invention, a contact width between the receiving-side rotating member and the web in the width direction is larger by at least 1 mm and at most 15 mm than a contact width between the feeding electrode and the web in the width direction.

In the power feeding method according to still another exemplary embodiment of the present invention, the contact width between the receiving-side rotating member and the web in the width direction is smaller than the contact width between the feeding electrode and the web in the width direction.

In the power feeding method according to still another exemplary embodiment of the present invention, a contact pressure is applied so that a contact area where the feeding electrode contacts the conductive surface satisfies the following numeral formula.

$$\frac{I^2 \cdot R}{Q \cdot t} \leq A \leq 1000 \qquad \text{NUMERAL FORMULA 1}$$

A: contact area between the feeding electrode and the conductive surface [mm$^2$]
I: current value supplied to the feeding electrode [A]
R: contact resistance value in the contact between the feeding electrode and the conductive surface [Ω]
t: thickness of the electrically conductive layer on the conductive surface where the feeding electrode contacts the conductive surface [mm]
Q: threshold heat quantity factor [W/mm$^3$]=5.5×10$^3$ Still another exemplary embodiment of the present invention relates to a continuous electrolytic plating apparatus for web for electrolytically plating a web comprising a conductive surface as at least one of surfaces thereof in a plating tub while continuously transporting the web, comprising at least two rotating members placed to face each other and nipping the web to be pressed onto one end of the conductive surface in a width direction, wherein at least one of the rotating members constitutes a feeding electrode, and the rotating members are rotated about the same velocity to a velocity of the transportation of the web.

In the continuous electrolytic plating apparatus for web according to still another exemplary embodiment of the present invention, wherein the electrode is provided solely outside the plating tub.

The continuous electrolytic plating apparatus for web according to still another exemplary embodiment of the present invention comprises a transporting device which transports the web in a longitudinal direction so that the width direction of the web is along a vertical direction, wherein the feeding electrode is provided to be pressed onto only an upper end of the web.

Still another exemplary embodiment of the present invention relates to a continuous electrolytic plating apparatus for web for electrolytically plating a web comprising a conductive surface as at least one of surfaces thereof in a plating tub while continuously transporting the web, comprising at least two rotating members placed to face each other and nipping the web to be pressed onto both ends of the conductive surface in a width direction, wherein at least one of the rotating members constitutes a feeding electrode, and the rotating members are rotated about the same velocity to a velocity of the transportation of the web.

In the continuous electrolytic plating apparatus for web according to still another exemplary embodiment of the present invention, the rotating member on a receiving side which nips the web together with the feeding electrode has an elastic member on an outermost layer thereof.

In the continuous electrolytic plating apparatus for web according to still another exemplary embodiment of the present invention, the feeding electrode comprises an electrically conductive layer on a surface layer thereof and an elastic layer inside the electrically conductive layer.

In the continuous electrolytic plating apparatus for web according to still another exemplary embodiment of the present invention, a contact width between the receiving-side rotating member and the web in the width direction is larger by at least 1 mm and at most 15 mm than a contact width between the feeding electrode and the web in the width direction.

In the continuous electrolytic plating apparatus for web according to still another exemplary embodiment of the present invention, the contact width between the receiving-side rotating member and the web in the width direction is smaller than the contact width between the feeding electrode and the web in the width direction.

Still another exemplary embodiment of the present invention relates to a multi-stage continuous electrolytic plating apparatus for web, wherein a plurality of the plating tubs are provided, the feeding electrode is placed outside the plating tub in an upstream side and/or a downstream side in a transportation direction of the respective plating tubs, the web is continuously thrown into the respective plating tubs so that a desirable plating film thickness is obtained, and the respective plating tubs are adapted such that the following numeral formula is satisfied.

$$\frac{B}{2} < X \leq \frac{500 \cdot N \cdot W}{(I \cdot W \cdot L)^2 \cdot p \cdot \log\left(\frac{t+W}{t}\right)} \qquad \text{NUMERAL FORMULA 2}$$

X: distance in the transportation direction of the web between the feeding electrode and a gateway of the plating tub which is the closest to the center of rotation of the rotating member in contact with the web [mm]
B: length of a power feeder in the transportation direction [mm]
I: current density [A/dm$^2$]
W: width of the conductive surface [mm]
L: length of the plating tub in the transportation direction [mm]
ρ: conductive film surface resistivity of the film with the conductive film to be thrown into the plating tub [Ω/□]
t: contact width between the feeding electrode and the conductive surface in the width direction [mm]
N: feeding electrode factor (2 in the case where it is provided on both sides, 1 in the case where it is provided on one side)

Still another exemplary embodiment of the present invention relates to a method for manufacturing a plastic film with a plated film, wherein a plastic film is used as the web, and the power feeding method or the continuous electrolytic plating apparatus is used in at least a part of manufacturing steps.

In an embodiment of the present invention, "the conductivity is possessed" when the surface resistivity is at most 100Ω/□.

The "conductive surface" denotes one of the surfaces of the web having conductivity. Only one of the surfaces may be the conductive surface, and the both surfaces may be the conductive surfaces.

A mechanism which applies at least a force allowing the web to travel and a mechanism which guides the web constitute the "transporting device". Examples of the transporting device include a group of transportation rollers and a belt conveyer.

"The rotating member is rotated about the same velocity to a transportation velocity of the web" means that the rotating member is rotated such that a difference between the circumferential velocity of the rotating member and the transportation velocity of the web is at most ±10%. The velocity difference is preferably smaller, and the rotating member is preferably rotated with a velocity difference at most ±5%, and more preferably rotated with a velocity difference at most ±1%. The rotating member may be rotated about the same velocity in such a manner that is driven by the web, or the rotating member may be aggressively driven and thereby synchronized with the transportation velocity of the web.

"The section of the web targeted for the plating" denotes a section subjected to the plating in the plating tub.

The "surface resistivity" denotes a resistance value per unit area. As a method for measuring it, the four-probe method is adopted pursuant to the JIS K7194-1994, and the surface resistivity can be obtained when a part relating to a thickness is ignored. The unit is "Ω", however, "Ω/□ (ohm per square), which is conventionally used as the unit of the surface resistivity, is adopted in order to clearly distinguish it from the resistance value "Ω".

In an embodiment of the present invention, the contact width between the receiving-side rotating member and the web in the width direction is preferably larger than the contact width between the feeding electrode and the web in the width direction by at least 1 mm and at most 15 mm because the contact resistance between the feeding electrode and the film conductive surface can be reduced. In the case where the surface layer of the receiving-side rotating member is elastic, the feeding electrode may have such a shape that is deformed into the receiving-side rotating member, which possibly generates creases in the web. However, this section, which will be finally cut off, is not included in a final product.

In an embodiment of the present invention, the contact width between the receiving-side rotating member and the web in the width direction is preferably smaller than the contact width between the feeding electrode and the web in the width direction because the deformation of the receiving-side rotating member which may be increased by an intensive pressure applied thereto is not extended to be larger than the contact width of the feeding electrode in the contact width direction, which prevents the generation of creases or the like in the web. The contact width between the receiving-side rotating member and the web in the width direction is preferably smaller than the contact width between the feeding electrode and the web in the width direction by at least 0.5 mm and at most 5 mm.

According to one aspect of the present invention, the conductive surface of the web can be plated without any contact of the metallic member constituting the feeding electrode with the surface of the web which will be included in the final product, the generation of scratches and fine protrusions resulting from the scratches can be controlled, and the plated film with a high quality in which the surface flaws are reduced can be provided. In addition, when the web is nipped with a linear pressure at least 0.5N/mm, the contact resistance between the feeding electrode and the web conductive surface can be reduced, which prevents the film from color-changing and altering owing to the heat generation in vicinity of the feeding electrode. Further, any possible force which may act against the transportation of the web can be controlled because the feeding electrode is the rotating member, which allows the web to be stably transported. Further, the materials causing the pollution such as the abrasion powder are not generated.

Further, the dimension of the feeding electrode can be reduced, which leads to the reduction of the dimension of the power feeding apparatus itself. As a result, the length of the plating tub can be extended without any increase in the dimension of the apparatus, which contributes to the improvement of productivity and the reduction of costs for the apparatus.

According to exemplary embodiments of the present invention, wherein the feeding electrode is provided solely outside the plating tub, the feeding performance can be stabilized because the deposition of the plating metal on the feeding electrode itself can be prevented, and an additional step such as a plating removal step becomes unnecessary. As a result, the costs for the apparatus can be reduced. Further, the heat generation resulting from the film resistance of the contact area of the feeding electrode can be controlled because the contact area of the feeding electrode is also plated.

Further, a larger voltage was conventionally necessary in the case where the film resistance of the web conductive film was large even though the plating was performed with the same current density. However, in the present exemplary embodiment, the plating can be realized with a small voltage because the distance from the rotational center of the feeding electrode to the inlet of the plating tub is optimized. As a result, power consumption can be reduced.

The present invention according to one aspect, wherein the plastic film as a flexible web can be stably transported, is suitable for the manufacturing of a plastic film with a plated film, and more suitably applied when copper, which is relatively soft and easily damaged, is plated. The effects of the invention, which are to control the surface flaws and to stably transport the web, can be most effectively exerted in the manufacturing of a substrate for flexible circuit for which a high surface quality is demanded.

BRIEF DESCRIPTION OF THE DRAWINGS

FIG. 1A is a schematic plan view of an example of a continuous electrolytic plating apparatus for web according to a preferred embodiment of the present invention.

FIG. 1B is a schematic perspective view in which vicinity of an electrode as an example of a power feeder is enlarged.

FIG. 1C is a schematic sectional view illustrating a structure of an example of the feeding electrode.

FIG. 1D is a schematic sectional view illustrating a structure of an example of the feeding electrode.

FIG. 2 is a graph illustrating an example of a relationship between a pressure and a contact resistance.

FIG. 3 is a conceptual view illustrating a method for measuring a contact resistance between the feeding electrode and a film conductive surface.

FIG. 4 is a graph illustrating a relationship between the pressure and the contact resistance.

FIG. 5 is a conceptual view illustrating a method for measuring a resistance value with a different conducting length.

FIG. 6 is a graph illustrating a relationship between the conducting length and the resistance value.

FIG. 7 is a conceptual view illustrating a method for measuring a contact resistance between an electrode having a roller shape used in a comparative example and the film conductive surface.

FIG. 8 is a conceptual view illustrating a method for measuring a contact resistance in the roller-shape electrode used in the comparative example when the conducting length is changed.

FIG. 9 is a graph illustrating a relationship between the pressure and the contact resistance.

EXPLANATION OF SYMBOLS 11 film with conductive film
111 plastic film
112 conductive film
12 wind-off section
13 preparatory washing section
14 power feeder
141 feeding electrode
142 receiving-side rotating member
143 pressure applying device
144 feeding terminal
145 elastic member
146 electrically conductive layer having a thin and cylindrical shape
147 electrode
1401 bearing case
1402 bracket
1403 slide guide
1404 bearing
15 plating tub
151 anode
152 seal unit
16 plating section
17 post-processor
18 reel-off section
31 direct-current power supply
32 voltmeter

DETAILED DESCRIPTION

Hereinafter, an exemplary embodiment of the present invention is described referring to an example where the present invention is applied to the manufacturing of a plastic film provided with a copper plated film on one surface thereof which is used for a flexible circuit substrate.

FIG. 1A is a schematic plan view of an example of a continuous electrolytic plating apparatus for web according to an exemplary embodiment. The apparatus is a multi-stage continuous electrolytic plating apparatus wherein a long film is wound off, plated, and reeled as a product roll. Main steps are handled by a wind-off section 12 which winds off a film 11 provided with a conductive film on one surface thereof, in which a conductive film 112 made of very thin copper alloy is formed by means of the sputtering process or the like on one surface of a plastic film 111, from a roller-shape member on which the film 11 is wound around, a preparatory washing section 13 which degreases and washes the conductive film 112 of the film 11 which was wound off, a plating section 16 comprising a feeder 14 which supplies power by making contact with the conductive film 112 and a plating tub 15, a post-processor 17 which performs processes such as rust prevention, washing and drying in order to prevent the oxidation of a plated coating film, and a reel-off section 18 which reels off the processed film. The preparatory washing section 13 may be omitted in the case where the conductive film 112 before the plating is clean, and the post-processor 17 may also be omitted if it is necessary to do so.

In the plating processor 16, the film 11 with the conductive film is nipped with a feeding electrode 141 in contact with the conductive film 112 and a receiving-side rotating member 142 in contact with the plastic film 111 in the feeder 14. The conductive film 112 is power-supplied by the feeding electrode 141, and the conductive film 112 dipped in a plating bath in the plating tub 15 thereby becomes a cathode, and then, an electric plating circuit is formed between the cathode and an anode 151. Then, the plating is performed. A slit as a passage for the film is provided in a gateway of the plating tub 15, and a seal unit 152 which controls the leak of the plating liquid from the slit by retaining the plating liquid in the plating tub 15 is provided. Suitable examples of the seal unit 152 are a seal unit which nips the film with two elastic rollers such as rubber rollers and a unit which controls an amount of the leaking liquid by controlling a gap between two plates.

A thickness of the plastic film 111 of the film 11 with the conductive film is preferably 5 μm-80 μm. Suitable materials thereof are polyester resin and polyimide resin. In the case of a product for applications of a semiconductor package or the like, for which heat resistance is demanded, in particular, a polyimide film is more suitably used. Various processes can be adopted when the conductive film 112 is formed. For example, the conductive film may be bonded to the film with an adhesive, or the conductive film may be directly formed on the film by means of the sputtering process, deposition process or the like. The bonding process in which the adhesive is used may be disadvantageous in that a heat resistant temperature of the adhesive is often lower than that of the film. Therefore, the conductive film is preferably directly formed on the film in view of heat resistance, and the sputtering process is preferably adopted in view of manufacturing costs. A film thickness of the conductive film 112 is preferably 0.02 μm-0.5 μm, and more preferably at least 0.08 μm in order to control any loss generated due to a large electric resistance of the film, and at most 0.25 μM in view of productivity.

FIG. 1B is a schematic view in which vicinity of the electrode is enlarged in an example of the feeder 14. The feeding electrode 141 and the receiving-side rotating member 142, which are rotatably supported, are placed so that they face each other with the film 11 with the conductive film therebetween. A pressure is applied by a pressure applying device 143, and the feeding electrode 141 is power-supplied by a feeding terminal 144. A spring or an air cylinder, for example, can be used as the pressure applying device 143. The electrode may be set on both ends of the film, or may be set on one end only. FIG. 2 illustrates an example of a relationship between the pressure and electric resistance generated by the contact. When the contact resistance is large, the Joule heat is unfavorably generated where the electrode and the conductive surface contact with each other, and the conductive film is thereby color-changed or altered. Therefore, the pressure to be applied is suitably at least 2N per 1 mm of a contact width t between the electrode and the conductive surface. The pressure to be applied is more suitably at least 5N per 1 mm of the contact width, and even more suitably at least 8N per 1 mm of the contact width in order to make the contact more stable. When such a large pressure that exceeds 100N per 1 mm of the contact width is applied, the contact resistance value is unlikely to largely reduce, while such a disadvantage that the structure is complicated or increased in size in order to withstand such a large pressure is generated. Therefore, the pressure to be applied is desirably at most 100N. The pressure is obtained from the product of a spring constant and an amount of displacement in the case where the spring is used to apply the pressure, and obtained from a pressure receiving area of an air cylinder and an air pressure in the case where the air cylinder is used to apply the pressure. A distance H from the end of the film to an inner-side edge of the feeding electrode is preferably at most 20 mm in order to secure as a large region where the scratches or the like are not generated as possible. The distance H is more preferably 5 mm-12 mm in order to secure the contact area between the feeding electrode and the film conductive surface and also to obtain as a large region where they do not contact each other as possible.

The feeding electrode 141 and the receiving-side rotating member 142 are rotatably supported, and may be driven to be rotated as the film is transported. A torque may be aggressively supplied to one or both of the rotating members so that they are driven. In the case where the electrode is provided on the both ends of the film, the respective electrodes are preferably rotated independently. In the case where the electrodes are mechanically coupled with each other at the both ends thereof and then rotated as in the dumbbell-shape electrode recited in the Patent Document 4, a slight velocity difference is likely to be generated.

A material of the feeding electrode 141 is preferably a metallic material having good conductivity such as copper or titanium, and further, a material having good conductivity and good corrosion resistance is more preferably used since the film may bring the plating liquid from the plating tub. FIGS. 1C and 1D illustrate a schematic sectional view of an exemplified structure of the feeding electrode 141. As shown in FIG. 1C, the electrode may be single-layered by means of a material, and a surface processing such as platinum plating may be applied to the electrode surface. The dimension of the electrode is desirably smaller so that the apparatus can be downsized. As a preferable constitution, as shown in FIG. 1D, an electrically conductive layer 146 having a thin and cylindrical shape in which metal such as nickel or titanium is formed into a cylindrical shape having a thickness at least 0.02 mm and at most 1 mm is embedded into a surface layer of an elastic member 145 such as rubber, and an electrode 147 is made to contact the electrically conductive layer 146 so as to feed power. Then, the elastic member 145 is deformed by the pressure, and the thin and cylindrical electrically conductive layer 146 is accordingly deformed. As a result, the area contacting the film conductive surface can be favorably increased.

In the case where an elastic member is provided on an outermost layer of the receiving-side rotating member, a similar effect can be favorably obtained. When the pressure at least 0.5 N per 1 mm of the contact width is applied in the case of the rotating member in which the elastic member is used as the rotating member, the contact resistance obtained when the metallic rotating members are nipped with the pressure of 2 N per 1 mm of the contact width can be similarly obtained, because the rotating member in which the elastic member is used can be largely deformed with a small force, which increases the contact area. The contact area is not so increased when the metallic rotating members are nipped with a large force. The contact area in this case may be very small, however, all of the currents flow into the small contact area, which significantly increases the Joule heat per unit area of the contact section. In the case where the contact resistance value is the same when the same current value is supplied, the Joule heat per unit area is reduced to a half when the contact area is doubled, which contributes to the control of the temperature increase. Therefore, the increase of the contact area by utilizing the deflection of the elastic member leads to the prevention of heat-related problems, which is suitable particularly when large currents are supplied. According to the findings obtained by the inventors of the present invention from their experiments, when the nipping pressure is applied such that the contact area stays within the range of the formula 3, the power feed can be favorably realized without such intensive heat generation that may burn the substrate. When the nipping pressure is applied such that the contact area stays within the range of the formula 4, the power feed can be favorably realized without the generation of heat shrinkage, drying spot and the like. Q: threshold heat quantity factor in the formulas 3 and 4 was obtained by the inventors of the present invention from their experiments such that an electrode having a certain contact area is connected to a substrate provided with a conductive film having a certain thickness, currents are supplied, a volume of heat generated by the Joule heat per unit area of an electrode contact section when such a heat-related problem as the heat shrinkage or combustion loss is generated, and a numeral value obtained by dividing the obtained heat volume is multiplied by a safety ratio $$\frac{I^2 \cdot R}{Q \cdot t} \leq A \leq 1000 \qquad \text{NUMERAL FORMULA 3}$$

A: contact area between the feeding electrode and the web-conductive surface [mm$^2$]
I: current value supplied to the feeding electrode [A]
R: contact resistance value in the contact between the feeding electrode and the web conductive surface [Ω]
t: thickness of the conductive surface where the feeding electrode and the web conductive surface contact each other [mm]
$Q_1$: threshold heat quantity factor [W/mm$^3$]=5.5×10$^3$ $$\frac{I^2 \cdot R}{Q \cdot t} \leq A \leq 1000 \qquad \text{NUMERAL FORMULA 4}$$

A: contact area between the feeding electrode and the web-conductive surface [mm$^2$]
I: current value supplied to the feeding electrode [A]
R: contact resistance value in the contact between the feeding electrode and the web conductive surface [Ω]
t: thickness of the conductive surface where the feeding electrode and the web conductive surface contact each other [mm]
$Q_2$: threshold heat quantity factor [W/mm$^3$]=0.7×10$^3$ Suitable examples of a material used for the elastic member are rubber such as nitrile rubber or fluororubber and resin such as polyester, and fluororubber superior in its chemical resistance is particularly suitably used. A degree of rubber hardness in the elastic member is preferably at least 40° and at most 90° in the JIS-A hardness. A thickness of the elastic member is not particularly limited, however is preferably smaller than the contact width in order to prevent it from deflecting in the case where the hardness is too low.

The feeding terminal 144 is necessarily adapted to be rotatable and electrically connected. A structure where the metallic electrode contacts the feeding terminal or a connecting terminal such as a slip ring or a rotary connector is suitably used.

A material used for the receiving-side rotating member 142 is, for example, stainless, however, is not particularly limited. However, a material having corrosion resistance is preferably used because it may contact the plating liquid brought by the film. The receiving-side rotating member 142 may have a single-layered structure or a multi-layered structure. A multi-layered structure comprising an elastic member such as rubber on a surface layer thereof is preferably adopted because the contact area between the film conductive surface and the feeding electrode can be increased.

A roughness of the surface of the feeding electrode contacting the film conductive surface is preferably Ra=0.1 μm-50 μm in terms of the arithmetic mean roughness regulated in the JIS B0601-2001. A surface having a large unevenness, in other words, a surface in which the arithmetic mean roughness is large contributes to the increase of the contact area because a surface area thereof is increased. However, too a large roughness does not allow the film conductive surface to closely contact it, and the actual contact area is thereby reduced. In order to secure the contact area with an appropriate pressure, Ra=0.8 μm-6.3 μm is more preferable.

Referring to FIG. 1A again, the feeder 14 is provided only in front of the plating tub 15, however, may be provided only behind the plating tub 15, before and after the plating tub 15 or inside the plating tub 15. In the case where the feeder 14 is provided inside the plating tub 15, the plating metal is deposited on the feeding electrode 141 itself, which requires a device for removing the plating metal and thereby complicates the apparatus structure. Therefore, the feeder 14 is preferably provided outside the plating tub.

In the case where the surface resistivity of the conductive film 112 of the film 11 with the conductive film is at least 0.1Ω/□, a voltage required for supplying predetermined currents is increased as a distance X from the feeding electrode to the gateway of the plating tub is larger, which increases power loss. Therefore, the distance X from the feeding electrode to the gateway of the plating tub is preferably set so that the numeral formula 5 is satisfied.

$$\frac{B}{2} < X \leq \frac{500 \cdot N \cdot W}{(I \cdot W \cdot L)^2 \cdot p \cdot \log\left(\frac{t+W}{t}\right)}$$ NUMERAL FORMULA 5

X: distance between the feeding electrode and the gateway of the plating tub which is the closest to the center of rotation of the rotating member in contact with the web in the transportation direction of the web [mm]
B: length of the feeding electrode in the transportation direction [mm]
I: current density [A/dm$^2$]
W: width of the web conductive surface [mm]
L: length of the plating tub [mm]
ρ: conductive film surface resistivity of the film with the conductive film [Ω/□]
t: contact width between the feeding electrode and the conductive surface of the web in the width direction [mm]
N: feeding electrode factor (2 in the case where it is provided on the both sides, 1 in the case where it is provided on one side)

The numeral formula 5 was derived based on the findings obtained by the inventors of the present invention. The left part shows a lower limit of X, which is a distance necessary to avoid any physical contact between the feeder 14 which is placed outside of the plating tub and the plating liquid. The right part shows an upper limit of X. When an object is electrically conducted, the Joule heat is generated. Such a range of heat volume that do not affect the conduction is experimentally obtained, and the volume of generated heat is calculated from the film resistance from the feeding electrode to the plating tub and the supplied current, and such X that is at most the heat volume which does not affect the conduction experimentally obtained earlier is obtained. The X is inversely proportional to the current density I and the resistivity p of the conductive film surface. 500 is a factor experimentally obtained, in which the safety ratio and the like is considered.

The continuous electrolytic plating device described thus far is capable of manufacturing a product having a good surface quality, and can be suitably applied to the manufacturing a plastic film provided with a plated film. The continuous electrolytic plating device can be suitably used for the manufacturing of applications of an electronic wiring, in particular, to the manufacturing of applications of a flexible circuit substrate. The continuous electrolytic plating device is particularly useful for the manufacturing of a plastic film provided with a plated film used in applications of a semiconductor package or the like, for which a high surface quality is demanded in response to the need for a fine processing because of a fine wiring pitch.

EXAMPLES

Below is described the present invention in detail referring to specific examples. The present invention, however, is not particularly limited to these examples.

Example 1

The device structure of the feeder is as shown in FIG. 1B. A bearing case 1401, a slide guide 1403, a bracket 1402 and a pressure-applying spring 143 were formed from stainless steel. A spring constant of the pressure-applying spring 143 was 14.7 N/mm. The feeding electrode constituted as shown in FIG. 10 and formed from titanium was used. A disc-shape member constituting the section contacting the film had the outer diameter of 60 mm, and the thickness of 10 mm. The both-shoulder C1 chamfer was applied thereto, and the width contacting the film was 8 mm. The arithmetic mean roughness of the contact surface was pursuant to the arithmetic mean roughness regulated in the JIS B0601-2001. The surface roughness measuring device, "Surtronic 25", manufactured by Taylor Hobson K. K., UK, was used to measure the surface roughness, and 4.7 μm was obtained. "Rotary Connector MODEL 1250-SC", manufactured by Mercotac Inc., US, was attached to a shaft-end portion to allow power to be supplied during the rotation. The receiving-side rotating member was formed from stainless steel, and had the outer diameter of 100 mm, and the thickness of 12 mm. The both-shoulder C1 chamfer was applied thereto, and the width contacting the film was 10 mm.

FIG. 3 is a conceptual view illustrating a method for measuring the contact resistance between the feeding electrode and the film conductive surface. A film obtained by plating copper by 8.5 μm on one surface of a polyimide film having the thickness of 38 μm was nippingly placed such that the centers of the feeding electrode and the receiving-side rotating member in the thickness direction were both at a position distant by 5 mm from an end of a film having the width of 15 mm in the width direction, and one side of a power supply was connected to the feeding terminal, while the other side thereof was connected to vicinity of the electrode contact section at a position distant by 12 mm from the end of the film in the width direction so as to obtain the circuit configuration shown in FIG. 3. Then, the resistance value was measured. The constant current of 0.5 A was supplied from a direct-current power supply 31, a voltage was measured by a voltmeter 32, and a resistance value was calculated according to the Ohm's law. FIG. 4 shows a measurement result in which the fluctuation of the resistance value was measured while the pressure was changed. The surface resistivity of the film used then was pursuant to the JIS K7194-1994, and the surface resistivity measuring device, "Loresta-GP" MCP-T600, manufactured by Mitsubishi Chemical Corporation, was used for the measurement. As a result, $1.92 \times 10^{-3} \Omega/\square$ was obtained.

The same measurement was conducted by using a film obtained such that copper alloy by 0.1 μm was formed by means of the sputtering process on one surface of a polyimide film having the thickness of 38 μm. A result thereby obtained is shown in FIG. 9. The surface resistivity of the conductive film formed by means of the sputtering process was $3.5 \times 10^{-1} \Omega/\square$.

FIG. 5 is a conceptual view illustrating a method for measuring the resistance value when a conducting length was changed. A film obtained by plating copper by 8.5 μm on one surface of a polyimide film having the thickness of 38 μm was nippingly placed such that the centers of the feeding electrode and the receiving-side rotating member in the thickness direction were both at a position distant by 5 mm from an end of a film having the width of 520 mm, and one side of a power supply was connected to the feeding terminal, while the other side thereof was connected to a position distant from the electrode contact position by 500 mm in the transportation direction so as to obtain the circuit configuration shown in FIG. 5. Then, the resistance value was measured. The constant current of 0.5 A was supplied from the direct-current power supply 31, a voltage was measured by the voltmeter 32, and the resistance value was calculated according to the Ohm's law. A distance from the section where the feeding electrode and the film contact each other to the measuring position in the film transportation direction was 500 mm. FIG. 6 shows a measurement result in which the resistance value was measured while the distance from the feeding electrode to the measuring position in the film width direction was changed.

A long polyimide film having the thickness of 38 μm and the width of 520 mm was used, and the feeder was placed at one position such that the centers of the feeding electrode and the receiving-side rotating member in the thickness direction were both at a position distant by 5 mm from an end of the film. Then, the contact pressures of 10 N/mm and 20 N/mm per 1 mm of the contact width were applied, and the film was transported at the velocity of 2 m/min. As a result, the rotation was obtained by the film tension in either of the contact pressures, any deviation and creases were not generated, and the generation of scratches was not detected in other than the contact section.

It can be learnt from the foregoing results that, in the case where the polyimide film provided with the copper plated film, which is used for applications of the flexible circuit substrate, by the continuous electrolytic plating apparatus in which the feeder is provided, the feeding electrode and the like do not contact the center of the film in the width direction, most of which will be included in a final product. As a result, a product in which surface flaws such as scratches are lessened can be obtained.

Example 2

A feeder structure similar to that of the Example 1 was used, the receiving-side rotating member had the diameter of 90 mm and the width of 6.5 mm in the contact width direction, and rubber having the thickness of 5 mm was wound around the surface layer. As the rubber, nitrile rubber at 80° in the JIS-A hardness (measured with a sample plate having the thickness of 5 mm) was used.

Various tests similar to those of the Example 1 were performed, in which the feeder was used, and results shown in FIGS. 4, 6 and 9 were obtained.

A long polyimide film having the thickness of 38 μm and the width of 520 mm was used, and the feeder was placed at one position such that the centers of the feeding electrode and the receiving-side rotating member in the thickness direction were both at a position distant by 5 mm from an end of the film. Then, the contact pressures of 10 N/mm and 20 N/mm per 1 mm of the contact width were applied, and the film was transported at the velocity of 2 m/min. As a result, any deviation and creases were not generated, and the generation of scratches was not detected in other than the contact section in either of the contact pressures. The rotating member was driven to be rotated with the contact pressure of 20 N/mm, however, the transportation could be more stable when the feeding electrode was secondarily rotated because a large torque was necessary for the rotation.

It can be learnt from the foregoing results that, in the case where the polyimide film provided with the copper plated film, which is used for applications of the flexible circuit substrate, by the continuous electrolytic plating apparatus in which the feeder is provided, the feeding electrode and the like do not contact the center of the film in the width direction, most of which will be included in a final product. As a result, a product in which surface flaws such as scratches are lessened can be obtained.

Example 3

A feeder structure similar to that of the Example 1 was used, the receiving-side rotating member had the diameter of 90 mm and the width of 12 mm in the contact width direction, and rubber having the thickness of 5 mm was wound around the surface layer. As the rubber, nitrile rubber at 80° in the JIS-A hardness measured with a sample plate having the thickness of 5 mm was used.

Various tests similar to those of the Example 1 were performed, in which the feeder was used, and results shown in FIGS. 4 and 6 were obtained.

A long polyimide film having the thickness of 38 μm and the width of 520 mm was used, and the feeder was placed at one position such that the centers of the feeding electrode and the receiving-side rotating member in the thickness direction were both at a position distant by 5 mm from an end of the film. Then, the contact pressures of 10 N/mm and 20 N/mm per 1 mm of the contact width were applied, and the film was transported at the velocity of 2 m/min. As a result, it was confirmed that creases were generated in the film at the edge of the feeding electrode in either of the contact pressures, however, the generation of scratches was not detected in other than the contact section which will be include in a final product. The rotating member was driven to be rotated with the contact pressure of 20 N/mm, however, the transportation could be more stable when the feeding electrode was secondarily rotated because a large torque was necessary for the rotation.

It can be learnt from the foregoing results that, in the case where the polyimide film provided with the copper plated film, which is used for applications of the flexible circuit substrate, by the continuous electrolytic plating apparatus in which the feeder is provided, the feeding electrode and the like do not contact the center of the film in the width direction, which will be included in a final product. As a result, a product in which surface flaws such as scratches are lessened can be obtained.

Example 4

A feeder structure similar to that of the Example 1 was used, the receiving-side rotating member had the diameter of 90 mm and the width of 7 mm in the contact width direction, and rubber having the thickness of 5 mm was wound around the surface layer. As the rubber, ethylenepropylene rubber at 40° in the JIS-A hardness measured with a sample plate having the thickness of 5 mm was used. This feeder was used as the feeder 14 in the plating apparatus shown in FIG. 1A, and the current value was set to 170 A. Then, a continuous plating experiment was conducted. A medium in which copper was formed by 7 μm as a conductive film on one surface of the 38 μm polyimide film, "Kapton EN" (manufactured by DU PONT-TORAY CO., LTD.) was used, and the nipping pressure was set to 5 N/mm. The contact area at the time was 200 mm$^2$. The contact resistance value was 30 mΩ, and the contact area range calculated when it is assigned to the formula 3 was 22 mm$^2 \leq A \leq$ 1,000 mm$^2$. The contact area was, therefore, within the calculated range.

As a result, the plating process was favorably performed without generating heat-related problems, for example, the medium may be burnt.

Comparative Example 1

A measurement similar to that of the Example 1 was conducted to a conventional roller-shape electrode. The roller-shape electrode had a structure in which a copper roller was attached to a brass shaft, an outer diameter of the roller was 80 mm and a surface length of the roller was 580 mm, and the center of the surface length of the roller and the center of the film in the width direction were aligned with each other.

FIG. 7 illustrates a method for measuring the contact resistance between the feeding electrode and the film conductive surface. A film having the width of 520 mm was wrapped around so that the conductive surface thereof contacted the roller surface. One side of a power supply was connected to the feeding terminal, while the other side thereof was connected to a position distant by 2 mm from and end of the film in the width direction on the feeding-terminal side and a position distant by 3 mm from a position where the roller and the film started to separate from each other in the transportation direction. A weight M was attached to near the center of the pendant film so that the film tension was set to 40 N-400 N, and the measurement was performed. In any of the set tensions, the stability was obtained in 120 mΩ in the case of the copper plated film of 8.5 μm, and in 200 mΩ in the case of the copper alloy sputtered film of 0.1 μm. It was confirmed that the Examples 1-3 showed the resistance which was lower than that of the comparative example.

A circuit configuration shown in FIG. 8 was obtained, and the relationship between the conducting length and the resistance value was measured with the film tension of 50 N. A result thereby obtained is shown in FIG. 6. The "position in the width direction" in the horizontal axis shown in FIG. 6 corresponds to the "position in the width direction" shown in FIG. 8.

When the polyimide film having the copper plated film used for applications of the flexible circuit substrate was manufactured by the continuous electrolytic plating apparatus in which the roller-shape electrode is adopted, scratches were generated 100%, and approximately 10% of the generated scratches were such that could make a product to be judged as an inferior product.

Summary of FIGS. 4, 6 and 9
1) FIGS. 4 and 9: Relationship between the pressure and resistance value a) In the power feeding method according to the comparative example 1, the resistance value was 120 mΩ for the 8.5 μm plated film. In contrast, the Examples 1-3 showed the result in FIG. 4. Accordingly, it is known that the pressure at least 2 N/mm is preferably applied in any of the Examples 1-3 in order to obtain at most the resistance value according to the comparative example 1 (120 mΩ) so that the feeding capacity equal to that of the comparative example 1 (conventional technology) can be obtained.

b) In the power feeding method according to the comparative example 1, the resistance value was 200 mΩ for the 0.1 μm sputtered film. In contrast, the Examples 1-3 showed the result in FIG. 9. Accordingly, it is known that the pressure at least 2 N/mm is preferably applied in any of the Examples 1-3 in order to obtain at most the resistance value according to the comparative example 1 (200 mΩ) so that the feeding capacity equal to that of the comparative example 1 (conventional technology) can be obtained.

c) The reduction of the resistance value in response to the increase of the pressure is more remarkable in the Examples 2 and 3 than in the Example 1. The reduction is thus more remarkable probably because the area of the feeding electrode contacting the film conductive surface is significantly increased by the deformation induced by the rubber used in the receiving-side rotating member when the pressure is applied.

d) The difference between the Examples 2 and 3 was generated probably because the resistance value was reduced because the contact width of the receiving-side rotating member was larger in the Example 3 than in the Example 2, and the contact area was larger in the Example 3. The film may undergo creases at the edge of the feeding electrode, however, this is not a problem in most cases because the relevant part will be cut off and will not be included in a final product. However, the generated creases may cause troubles during the transportation, and the product width will be reduced because a removal margin is large when the relevant part is finally cut off and discarded. In order to avoid such disadvantages, therefore, the Example 2 is preferably adopted unless it causes any problem in the resistance value. The Example 3 is preferable in the case where creases are hardly generated, or the creases, if generated, will not cause any trouble during the transportation.

2) FIG. 6: Relationship between the position of the film in the width direction and the resistance value a) The power is supplied such that the electrode contacts the entire area in the width direction in the comparative example, while the power is supplied such that the electrode contacts only the end portion in the Examples 1-3, which possibly generates the irregularity in the power supply in the width direction. Therefore, this issue was examined.

b) As shown in FIG. 6, the resistance values ranging from 60 mΩ to 120 mΩ were obtained in the comparative example 1, wherein such a large difference as nearly twice was seen when the largest value and smallest value were compared to each other. It is assumed that such a large variability is generated under the influence of the in-plane resistance variability in the film conductive surface. The resistance values in the Examples 1-3 are as shown as below. The resistance value in the Example 1 is in the range of 60-90 mΩ, the resistance value in the Example 2 is in the range of 25-40 mΩ, and the resistance value in the Example 3 is in the range of 10-20 mΩ, wherein the variation of the resistance value is not in such a broad range as in the comparative example. Thus, it can be said that the feeding irregularity in the width direction, which is comparable to that of the conventional technology, could be surely obtained.

The present invention is not limited to the manufacturing of a film having a copper plated coating film, and can be applied to an electrolytic plating apparatus in which metal is used, and an electrolytic plating apparatus in which a medium other than a resin film is used. However, the application of the present invention is not limited to any of them.

The invention claimed is:

1. A power feeding method for an electrolytic plating method for electrolytically plating a web comprising a conductive surface as at least one of the surfaces thereof in a plating tub, the method comprising:
continuously transporting the web,
nipping the web with at least two rotating members so that the web faces one end thereof or both ends thereof in a width direction, at least one of the rotating members is used as a feeding electrode and comprises an electrically conductive layer on a surface layer thereof so that the web in the plating tub is power-supplied, and the feeding electrode further comprises an elastic layer inside the electrically conducive layer, or a rotating member on a receiving side which nips the web together with the feeding electrode comprises an elastic member on a surface layer thereof, or the feeding electrode comprises the elastic layer inside the electrically conductive layer and the rotating member on the receiving side which nips the web together with the feeding electrode comprises the elastic member on the surface layer thereof,
pressing the electrode onto the web only in a region distant by at least 0.5 mm and at most 20 mm from the end of the web in the width direction with a contacting pressure of at least 0.5 N and at most 100 N per 1 mm of a contact width in the width direction, and
rotating the rotating members about the same velocity to a velocity of the transportation of the web.

2. The power feeding method as claimed in claim 1, wherein the electrode is placed outside of the plating tub, and power is supplied in a section of the web targeted for the plating only in an upstream side and/or a downstream side of the plating tub in a transportation direction.

3. The power feeding method as claimed in claim 1, wherein
the web is transported in a longitudinal direction so that the width direction thereof is along a vertical direction.

4. The power feeding method as claimed in claim 1, wherein
the contact width between the receiving-side rotating member and the web in the width direction is larger by at least 1 mm and at most 15 mm than a contact width between the feeding electrode and the web in the width direction.

5. The power feeding method as claimed in claim 1, wherein
the contact width between the receiving-side rotating member and the web in the width direction is smaller than the contact width between the feeding electrode and the web in the width direction.

6. The power feeding method as claimed in claim 1, wherein
the contact pressure is applied so that a contact area where the feeding electrode contacts the conductive surface satisfies the following numeral formula:

$$\frac{I^2 \cdot R}{Q \cdot t} \leq A \leq 1000 \quad \text{NUMERAL FORMULA 1}$$

A: contact area between the feeding electrode and the conductive surface [mm$^2$]
I: current value supplied to the feeding electrode [A]
R: contact resistance value in the contact between the feeding electrode and the conductive surface [Ω]
t: thickness of the electrically conductive layer on the conductive surface where the feeding electrode contacts the conductive surface [mm]
Q: threshold heat quantity factor [W/mm$^3$]=5.5×10$^3$.

7. A power feeding method for an electrolytic plating method for electrolytically plating a web having conductivity on surfaces thereof in a plating tub, the method comprising:
continuously transporting the web in the plating tub,
nipping the web with at least two rotating members so that the web faces one end thereof or both ends thereof in a width direction, at least one of the rotating members is used as a feeding electrode and comprises an electrically conductive layer on a surface layer thereof so that the web in the plating tub is power-supplied, and the feeding electrode further comprises an elastic layer inside the electrically conducive layer, or a rotating member on a receiving side which nips the web together with the feeding electrode comprises an elastic member on a surface layer thereof, or the feeding electrode comprises the elastic layer inside the electrically conductive layer and the rotating member on the receiving side which nips the web together with the feeding electrode comprises the elastic member on the surface layer thereof,
pressing the electrode onto the web only in a region distant by at least 0.5 mm and at most 20 mm from the end of the web in the width direction with a contacting pressure of at least 2 N and at most 100 N per 1 mm of a contact width in the width direction, and
rotating the rotating members about the same velocity to a velocity of the transportation of the web.

8. A power feeding method for use in a process for electrolytically plating a web having a conductive surface, the method comprising:
nipping the web with at least two rotating members;
using at least one of the rotating members as a feeding electrode to supply power to the web in a plating tub, the feeding electrode comprising an elastic layer inside the electrically conducive layer, or a rotating member on a receiving side which nips the web together with the feeding electrode comprises the elastic member on a surface layer thereof, or the feeding electrode comprises the elastic layer inside the electrically conductive layer and the rotating member on a receiving side which nips the web together with the feeding electrode comprises the elastic member on the surface layer thereof;
pressing the feeding electrode onto the web only in a region spaced by at least 0.5 mm and at most 20 mm from the end of the web in the width direction with a contacting pressure of at least 0.5 N and at most 100 N per 1 mm of a contact width in the width direction; and
rotating the rotating members at about the same velocity as a velocity of the web.

* * * * *